United States Patent
Vukovic et al.

(10) Patent No.: US 7,084,573 B2
(45) Date of Patent: Aug. 1, 2006

(54) MAGNETICALLY ENHANCED CAPACITIVE PLASMA SOURCE FOR IONIZED PHYSICAL VAPOR DEPOSITION

(75) Inventors: Mirko Vukovic, Gilbert, AZ (US); Derrek Andrew Russell, Torrance, CA (US)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 10/794,360

(22) Filed: Mar. 5, 2004

(65) Prior Publication Data

US 2005/0194910 A1    Sep. 8, 2005

(51) Int. Cl.
*H01J 7/24*     (2006.01)
*H01J 17/26*    (2006.01)
*C23C 14/00*    (2006.01)

(52) U.S. Cl. ............ 315/111.41; 315/111.71; 204/192.12; 313/231.31

(58) Field of Classification Search ........... 315/111.21, 315/111.41, 111.71; 313/231.31; 204/192.12
See application file for complete search history.

(56) References Cited

U.S. PATENT DOCUMENTS

| | | | | |
|---|---|---|---|---|
| 5,274,306 A | * | 12/1993 | Kaufman et al. | 315/111.41 |
| 5,326,981 A | * | 7/1994 | Hara et al. | 250/492.21 |
| 5,717,294 A | * | 2/1998 | Sakai et al. | 315/111.41 |
| 5,828,176 A | * | 10/1998 | Goebel | 315/111.41 |
| 5,972,185 A | * | 10/1999 | Hendricks et al. | 204/298.41 |
| 6,254,745 B1 | * | 7/2001 | Vukovic | 204/298.06 |
| 6,896,775 B1 | * | 5/2005 | Chistyakov | 204/192.32 |
| 2004/0094402 A1 | * | 5/2004 | Gopalraja et al. | 204/192.12 |

OTHER PUBLICATIONS

Plasma Physics, Chapter VIII. Processing Plasmas, pp. 5-6, www.physics.usyd.edu.au/~mmmb/plasma/chapter8.pdf , Last updated on Feb. 2003.*

* cited by examiner

*Primary Examiner*—Tan Ho
*Assistant Examiner*—Angela M Lie
(74) *Attorney, Agent, or Firm*—Wood, Herron & Evans, L.L.P.

(57) ABSTRACT

A capacitive plasma source for iPVD is immersed in a strong local magnetic field, and may be a drop-in replacement for an inductively coupled plasma (ICP) source for iPVD. The source includes an annular electrode having a magnet pack behind it that includes a surface magnet generally parallel to the electrode surface with a magnetic field extending radially over the electrode surface. Side magnets, such as inner and outer annular ring magnets, have polar axes that intersect the electrode with poles closest to the electrode of the same polarity as the adjacent pole of the surface magnet. A ferromagnetic back plate or back magnet interconnects the back poles of the side magnets. A ferromagnetic shield behind the magnet pack confines the field away from the iPVD material source.

19 Claims, 2 Drawing Sheets

MAGNETICALLY ENHANCED CAPACITIVE PLASMA SOURCE FOR IONIZED PHYSICAL VAPOR DEPOSITION

This invention relates to ionized physical vapor deposition (iPVD), and more particularly to sources for the generation of high density plasma particularly useful for iPVD.

BACKGROUND OF THE INVENTION

Ionized physical vapor deposition such as is used in the manufacture of semiconductors is carried out by ionizing metal or other coating material in a high-density plasma then directing the ionized particles of coating material across the potential drop of a plasma sheath onto the substrate. Sources for creating such plasmas are either capacitively coupled or inductively coupled. Capacitively coupled sources energize processing gas within a vacuum processing chamber by coupling energy via an RF electrical field from electrodes. Inductively coupled plasma sources couple energy via an RF magnetic field from an antenna.

Capacitive sources are generally regarded as inferior to inductive sources because they produce a lower plasma density and large negative self-bias at the electrode. These characteristics of typical capacitive sources usually make them inappropriate for iPVD applications. Low plasma density is fundamentally related to the large RF voltage of capacitively coupled sources. Plasma density is a result of a balance between the energy input into the plasma by the RF and energy losses due to atomic processes and, more importantly, the kinetic energy or the ions falling through the plasma sheath and leaving the plasma. The large sheaths generated at the RF electrodes, which is the characteristic of a large potential difference between the plasma and the electrode, serve as sinks of plasma energy, and lead to the reduction in plasma density. In iPVD applications, low plasma density reduces the metal ion fraction. In addition, the large sheath voltage at the RF electrode leads to the sputtering of the electrode material into the plasma, reducing its lifetime.

ICP sources tend to be complex, particularly where they are designed to optimize deposition uniformity. Antennas and baffles must be designed using sophisticated methods.

Experimental work is reported on various plasma sources for certain applications. Furuya & Hirono examined the effects of magnetic field strength on the sputtering rate and bias voltage of an RF magnetron. They observed a reduction of the self-bias voltage, and an increase in plasma density as the field strength was increased. In addition, they observed a decrease in the sputtering rate as the magnetic field increased above 400 Gauss. In their experiment, a 4 in (10 cm) diameter CrCo target was used and the experiment was performed at 10 mTorr (1.33 Pa) and 200 W of RF power. [Furuya A & Hirono S, 1990, J. Appl. Phys., 68(1), 304 10.]

Further, I et al. (1984) examined the effects of magnetic field strength and pressure on the etch rate in a modified MRC RIE-51 diode etching system. With the magnetic field varied from 60 to 240 G, the bias voltage on the RF electrode dropped from 500 to 50 V. [I L, Hinson D C, Class W H & Sandstrom R L 1984 Appl. Phys. Lett. 44(2), 185.]

Magnetic field effects in a capacitive source with a localized magnetic field was explored by Wickramanayaka & Nakagawa (1998), for an embedded array of magnets in the top RF electrode of a dual-frequency capacitively coupled source for large area processing. The magnets are oriented in a checker-board fashion, leading to a rapid decrease of the magnetic field away from the electrode surface. The addition of magnets leads to a three-fold increase in plasma density, and a corresponding decrease in the self-bias voltage was observed. [Wickramanayaka S & Nakagawa Y 1998 Jpn. J. Appl. Phys. 37(11, Pt. 1), 6193.]

Further, Kaufman & Robinson (1993) proposed a broad beam ion source for space propulsion and industrial applications. [U.S. Pat. No. 5,274,306.]

Accordingly, there is a need for a simple high-density plasma source having low risk of producing discharges or contaminating particles.

SUMMARY OF THE INVENTION

An objective of the present invention is to provide a simple high-density plasma source, and a source that is particularly useful for iPVD. Another objective of the invention is to provide a plasma source that has reduced likelihood of producing electric discharges or particles that can contaminate the environment within a processing chamber. A further objective of the invention is to provide a plasma source that can be used as a replacement high-density plasma source. An additional objective of the invention is to provide a high-density plasma source that can be made to produce a symmetric and uniform plasma.

According to principles of the present invention, a high-density, capacitively coupled plasma source is provided with an RF electrode that is embedded in a magnetic field. The magnetic field may be generated by magnets or a magnet pack. The magnet pack may, for example, include a plurality of magnets and a yoke. The magnetic field lines lie substantially parallel to, or are congruent with, the surface of the electrode that faces the plasma or processing chamber.

In the illustrated embodiment, the source is a drop-in alternative to the ICP plasma sources of the type disclosed in U.S. Pat. No. 6,287,435. The magnetic field produced by the magnet pack of the source is designed to maximize the magnetic field strength near the electrode surface, while minimizing magnetic flux leakage. A ferromagnetic shield behind and surrounding the side of the magnet pack is effective in minimizing flux leakage. Minimizing the leakage may also be facilitated by configuration of the volume and strength of center and ring magnets of the magnet pack. Where the plasma source is to be located at the center of a sputtering target, flux leakage from the plasma source magnets can adversely alter the performance, or complicate the design of, the sputtering cathode assembly. For such applications particularly, the goal of the configuration is to cause substantially all of the flux that leaves the outer ring magnet to refrain from straying outward of the plasma source.

High strength magnetic fields are achieved by combining magnets that underlie the annular surface of the electrode with inside and outside magnets, such as ring-shaped magnets for example, and a back side yoke or back-side magnet ring and center magnets with magnets that line the electrode surface. Flux leakage, the geometry and strength of these magnets are carefully designed, with field strength preferably as large as possible. The high field strength reduces the DC voltage of the electrode, and allows the source to operate at higher pressures, up to at least approximately 100 mtorr.

The magnet-pack is, in the preferred embodiments, shielded from RF fields by a thin protective layer of copper or aluminum foil. Further, the magnets are preferably thermally insulated from it.

According to certain aspects of the invention, a source is provided with an RF electrode that is curved outward, or generally convex, to extend outward into the process chamber. This shape facilitates the expulsion of plasma from the source into the process volume.

In alternative embodiments of the invention, the source is configured as open at its center. With the open configuration, the center portion of the source may be used as a gas feed or a showerhead. Such a source may be flat or may be provided with geometry that is conical or cylindrical. Such alternatives configurations may be used to provide high plasma uniformity.

Advantages obtained by providing a plasma source with electrodes immersed in a magnetic field are that the plasmas in the magnetic fields exhibit natural modes of oscillations, called plasma waves. These are waves in an ordinary sense, with a velocity and a wavelength. This behavior is unlike that of an ICP source, where the plasma shields out the RF wave, confining it to its skin-depth, and where the concepts of wavelength and velocity are not valid. The plasma supports two types of waves, an electromagnetic, and an electro-static wave. These are two very different waves in their properties: wavelengths, energy transport mechanisms, and polarization. Unlike the electro-magnetic waves, the electro-static waves carry energy via electric fields and electron current. The electron current portion of the wave is responsible for energy dissipation and electron heating. In a helicon plasma, the electromagnetic wave is called the helicon wave.

Most embodiments of the sources according to the invention are expected to directly excite electro-static waves, with little or no power going into a helicon wave. This dissipates energy to the electrons close to the electrode, unlike typical capacitive sources where the RF energy is dissipated in the bulk plasma by RF current flows.

With sources according to the present invention, very good coupling is provided between the electric field and plasma waves, and the power transfer to the plasma is very efficient. As a result, the plasma presents a high impedance to the source. This results in lower RF voltages and reduced DC bias of the electrode. The net result is reduced sputtering of the electrode and increased plasma density.

In an iPVD module, the sources according to the present invention provide simplicity, symmetry, and high process performance.

Shaping the electrode while immersing it in a strong magnetic field further reduces sputtering of the electrode and increases plasma density. The hardware simplicity of the source make an attractive alternative to the inductively coupled plasma source. Appropriately configured, the source according to the invention can serve as a drop-in replacement plasma source, particularly providing added simplicity and improved plasma symmetry, without adversely affecting plasma uniformity and ambipolar drift.

The sources of the present invention provide the advantages of an ICP source without the need for a dielectric window and the baffle shield that are typically provided to protect the dielectric window.

These and other objectives and advantages of the present invention will be more readily apparent from the following detailed description of the drawings, in which:

DETAILED DESCRIPTION OF THE DRAWINGS

Figure 1:
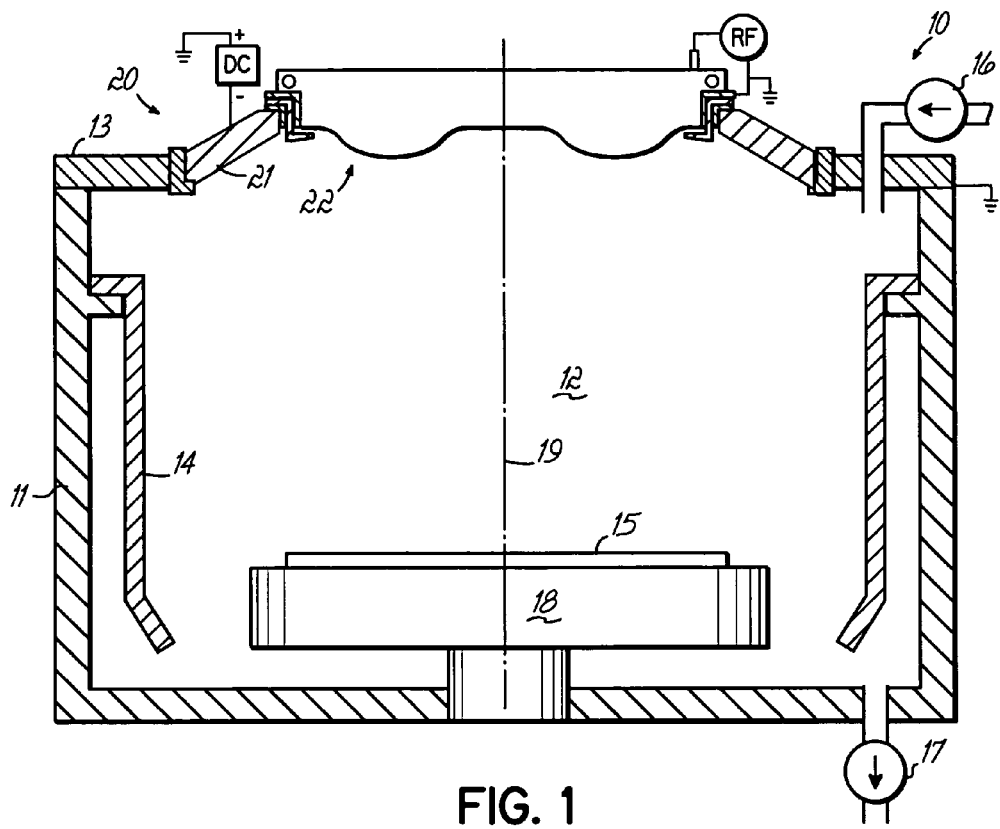
FIG. 1 is a cross-sectional diagram of an iPVD apparatus equipped with a high-density plasma source according to certain embodiments of the invention.

FIG. 1 illustrates a wafer processing apparatus 10, such as an ionized physical vapor deposition (iPVD) or sputter coating apparatus, in which semiconductor wafers 15 are processed by application of a metal film (not shown). The apparatus 10 includes a chamber wall 11 that surrounds a processing chamber 12 enclosed within. The chamber wall 11 is typically grounded. A lid 13 seals to and is grounded to the chamber wall.11, closing an opening in one end of the chamber 12. A processing gas source 16 supplies processing gas into the chamber 12, while a vacuum pump 17 maintains the gas at a vacuum pressure level within the chamber 12. A substrate support 18 within the chamber 12 supports a wafer therein for processing. A chamber shield 14, which is one of several shields, protects the chamber wall 11 and other more permanent components of the chamber from deposition. A coating material source 20 is provided, supported by the lid 13, and facing the wafer 15 on the support 18.

The material source 20 includes a sputtering target 21 of coating material, which, in the embodiment illustrated, is annular, more particularly is frusto-conical in shape. An RF energy source 22 is mounted in the opening in the center of the annular target 21, in the manner disclosed in detail in U.S. Pat. No. 6,287,435, hereby expressly incorporated herein by reference. In that patent, an ICP RF source is described having an antenna outside of the chamber behind a dielectric window that is protected from contamination by a slotted baffle.

An embodiment of an RF energy source 22, according to the present invention, includes a metal electrode 23 that is centered on an axis 19 of the chamber 12. The electrode 23 is mounted so as to seal the central opening in the target 21 with a surface 41 thereof facing the chamber 12. The electrode 23 is electrically insulated from the target 21 by a pair of annular insulators 24 and 25, between which is a grounded annular metal shield 26. The target 21 is electrically connected to the negative output of a DC power supply 27, while the electrode has a feed terminal 28a that connects to an RF output of an RF generator 28. Commercial HF frequencies may be used for the generator, but higher frequencies of about 60 MHz are preferred. Behind the electrode 23 is an annular magnet pack 30 that produces a magnetic field 31 in the shape of an annular magnetic tunnel centered on the axis 19 and extending over the surface 41 of the electrode 23 within the chamber 12.

The RF electrode 23 is preferably made of the same material as the sputtering target 21. The electrode 23 is embedded in a magnetic field 31 generated by magnets 32–36 and the ferromagnetic back piece 37 of the magnet-pack 30. These magnets include a surface magnet or electrode magnet formed of three concentric annular segments 33–35, each itself a magnet, having commonly oriented radial polar axes, and outer and inner side magnets 32 and 36, respectively. These side magnets 32 and 36 are illustrated as cylindrically shaped ring magnets. The back piece 37 may be a ferromagnetic yoke, for example. Ideally, the lines of the magnetic field 31 are generally parallel to, or congruent with, the surface 41 of the electrode 23 that faces the chamber 12. The electrode 23 has a water cooling channel 29 along its periphery that connects at its opposite ends to a circulatory cooling water supply system (not shown) in the apparatus 10.

Figure 2:
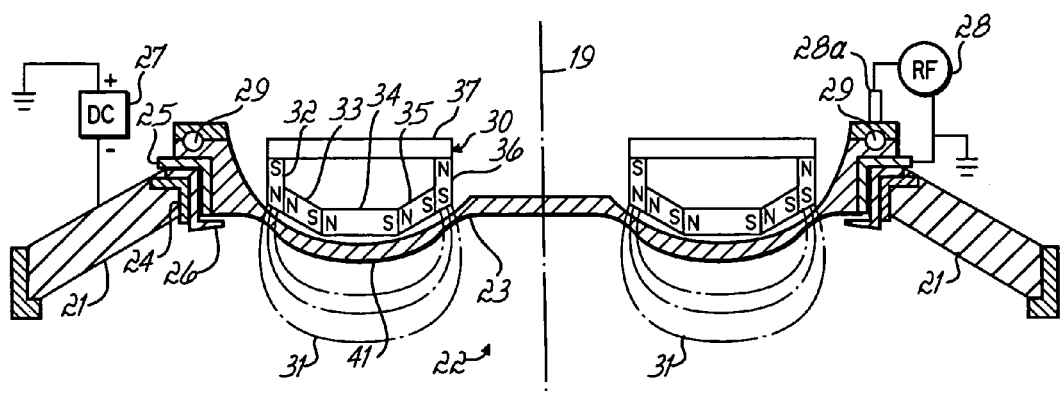
FIG. 2 is an enlarged cross-sectional view of the coating material source assembly of the iPVD apparatus of FIG. 1, showing the plasma source in greater detail.

The RF energy source 22 may be configured as a drop-in replacement to an existing ICP source. The RF source 22 thus lays on the sputtering target 21, separated by RF insulation 24, shown in FIG. 2. Such an ICP source for an iPVD apparatus is described in U.S. patent application Ser. No.: 09/896,890, filed Jun. 29, 2001, hereby expressly incorporated herein by reference. To replace such an IPVD source assembly, the source would include, for example, a housing assembly having an external ground connector, an external target power connector, an RF power source connector, external cooling fluid recirculating ports, an internal target power terminal, an internal RF connector, a plurality of internal cooling fluid ports, and support structure configured to seal the source around an opening at the top of a chamber.

Due to the magnetic field configuration, some parts of the electrode 23 may be prone to sputtering, so it is preferable that the electrode be made of the same material as the sputtering target 21. A shield 26 may optionally be provided between the target 21 and the source 22 to provide the plasma with a local ground or other reference with respect to which the plasma can establish a potential. The shield 26 is mounted between the insulator 24, which insulates the shield 26 from the target 21, and insulator 25, which insulates the shield 26 from the electrode 23. The shield 26 is also preferably made of the same material as the electrode 23. The shield 26, if provided, may be grounded, or it may be DC biased to some other potential, or even floating, depending on process considerations.

The magnetic field 31 is designed to maximize the magnetic field strength near the surface 41 of the electrode 23. Minimizing flux leakage is also desirable and can be achieved by using ferromagnetic shield 37b, instead of, or preferably in addition to, the ferromagnetic back piece 37, as described in connection with FIG. 5 below. Other design approaches can further reduce flux leakage somewhat, such as the careful design of the volume and strength of the magnet pack 30, particularly the inner ring magnet 36 and the outer ring magnet 32 thereof. In applications where leaking magnetic flux could interfere with other chamber components, such as a magnetron sputtering cathode assembly, the goal is to ensure that substantially all of the flux of the magnetic field 31 is confined within the plasma source 22.

High strengths for the magnetic field 31 can be achieved by combining the outer and inner ring magnets 32 and 36 with the magnets that line the electrode surface 41 in the annular region of the electrode 23 between the ring magnets 32 and 36, for example, with magnets 33–35. The geometry and strength of these magnets 33–35 can be optimized to further minimize flux leakage. The side magnets 32 and 36 have their polar axes generally perpendicular to the surface of the electrode 23, with the magnet pole that is closer to the electrode 23 being of the same polarity as the adjacent pole of the surface magnet 33–35. In the illustrations, this is the N-pole for the outer side magnet and the S-pole for the inner side magnet. Since placing common poles of the magnets of the magnet pack 30 adjacent each other result in magnetic forces that tend to cause the magnets to separate, the magnets of the magnet pack 30 are preferably encased in a resin or other enclosure (not shown).

The strength of the magnetic field 31 is preferably as large as possible, and for example, at least larger than 1 kG. The high field strength reduces the DC voltage of the electrode 23 and allows the RF source 22 to operate at higher pressures, for example up to 100 mTorr or higher. The electrode magnets 33–35 contribute the most to the strength of the magnetic field 31 that extends over the chamber-side surface of the electrode 23. The addition of the side magnets 32 and 36, along with a back piece 37 in the form of an iron yoke, increase the magnetic field 31 by about 30%. The use of thicker electrode magnets 33–35 also results in an increase in the strength of the magnetic field 31. Using bonded NeFeB for the material of which the magnets are made produces a strength of the magnetic field 31 at about 400–500 Gauss, where using a stronger NeFeB magnet material produces a field strength of about 1400–1500 Gauss.

The magnet-pack 30 is preferably shielded from RF fields by a thin protective layer of copper or aluminum foil (not shown) to minimize RF heating of and energy losses to the magnets 32–36 and yoke 37 of the magnet pack 30. Furthermore, as the electrode 23 may become quite hot, the magnets 32–36 and other components of the magnet pack 30 may be thermally insulated from the shield 23.

The RF electrode 23 and its surface 41 are convex, or curved "outward" into the chamber 12. This shape facilitates the expulsion of plasma from the source into the process volume. The curvature of the lines of the magnetic field 31 and the curvature of the surface of the electrode 23 that faces the chamber 12 are substantially the same. To best achieve this, the electrode 23 and the magnet pack 30 can be designed together, and the design of either one may be modified to conform to the shape of the other. The design goal should be to match the shape of the chamber-side surface of the electrode 23 to that of the magnetic field 31 across most of this surface between the inner and outer edges of the electrode, with the field 31 only curving into the electrode 23 in the vicinity of the side magnets 32 and 36.

Figure 3:
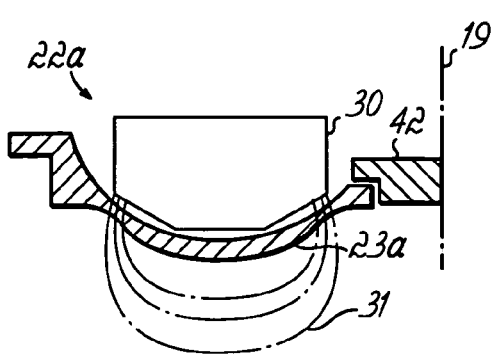
FIG. 3 is an enlarged cross-sectional view, similar to FIG. 2, of an alternative coating material source assembly.

Other embodiments can be based on providing an open RF source 22a, by separating the center portion around the axis 19 from the electrode 23. This leaves the electrode 23a as shown in FIG. 3 with a center section 42 that may be electrically or physically separate from the electrode 23. Such a configuration may be advantageous for certain processing applications, particularly where plasma uniformity is of greater importance. The center portion 42 of the source 23a can be used as a gas feed, a showerhead or a plasma shaping electrode, for example.

Figure 4:
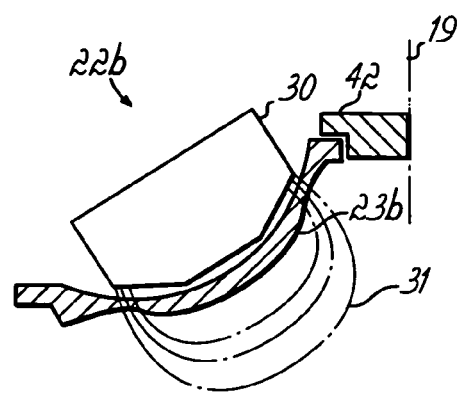
FIG. 4 is another enlarged cross-sectional view, similar to FIGS. 2 and 3, of another alternative coating material source assembly.

Another embodiment may involve an open RF source 22b in which an electrode 23b is provided having a non-planer geometry, such as conical, as illustrated in FIG. 4, or cylindrical (not shown).

Figure 5:
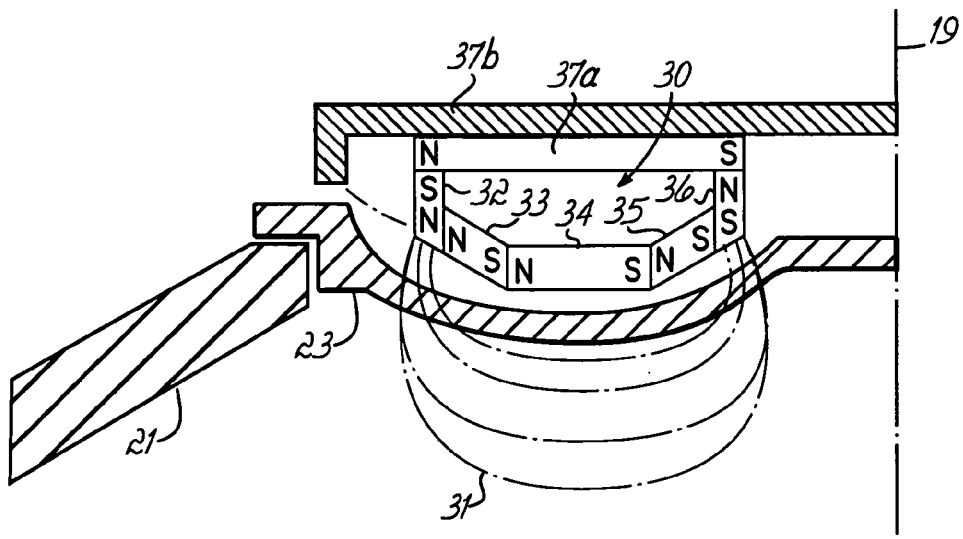
FIG. 5 is another enlarged cross-sectional view, similar to FIG. 2, illustrating additional features of certain embodiments of the plasma source.

As illustrated in FIG. 5, a back magnet 37a may be provided for the back piece 37 in lieu of a yoke of ferromagnetic material, thereby increasing the strength of the magnetic field 31 by about 10%. This back magnet 37a increases the strength of the magnetic field 31 at the electrode 23. Further, to reduce flux leakage, a shield 37b of ferromagnetic material may be provided, either in addition to the back piece 37 or which also serves the purpose of the yoke or magnet of the back piece 37. Such a shield 37b preferably has a planar disc portion located behind the magnet pack 30, which is integral with a cylindrical edge portion that surrounds the magnet pack 30 outside of the outer side magnet 32. This configuration confines the magnetic field from the magnet pack 30 to radially within the outer diameter of the plasma source 22, so that the magnetic fields from the plasma source 22 are not coupled to any magnetic fields associated with target 21.

Figure 6:
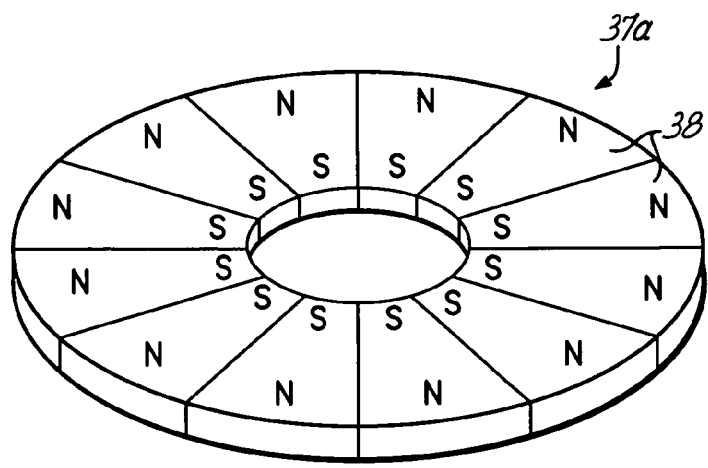
FIG. 6 is a perspective diagram of a back magnet of the plasma source of FIG. 5.

As illustrated in FIG. 6, the back magnet 37a is preferably manufactured in segments 38. For a generally circular or annular back magnet 37a, such segments are generally wedge-shaped angular segments set side by side to form an annular ring, each with a radially oriented polar axis. Such segmented construction may be provided for any of the magnets 32–36, with the polar axes of each of the segments of such magnets extending between the N and S poles illustrated in the figures.

The shield 37b in FIG. 5 is shown as a separate shield from magnet 37a or other back piece. Such a shield may be made of steel, such as 1008 or 1010 steel for example, and should be a few millimeters thick. The outer cylindrical section of the shield is preferably about 2–3 centimeters from the outer magnet 32.

The RF source 22, according to the present invention, is neither a magnetically enhanced reactive ion etcher (ME-RIE), nor an ECR source, nor a helicon source. It has some of the characteristics of electrode-magnetic field interaction of an RF magnetron or of the plasma propulsion source proposed by Kaufman & Robinson (1993) in U.S. Pat. No. 5,274,306, which is a broad beam ion source used for space propulsion and industrial applications. The magnetic field and electrode configuration of that patent have some parallel to the open configuration and cylindrical geometry of the embodiment of the present invention of FIG. 4.

Further, the mechanism of energy transfer to the electrons with the source of the present invention is fundamentally different than with an ECR source. In an ECR source, the RF field is matched to the local cyclotron frequency in a manner that constantly accelerates electrons. In the source of the present invention, the electric field generates sheets of electron current parallel to the electrode face. These current sheets oscillate and dissipate in collisions with the gas and plasma ions.

Sources according to the present invention similarly differ from those of magnetically enhanced reactive ion etchers. Magnetically enhanced capacitive sources of such etchers are similar to ECR sources, as they depend on the cyclotron motion of the electrons. In these sources, the RF field frequency is twice the electron cyclotron frequency. At the plasma sheath interface, the oscillating sheath accelerates electrons during each half cycle of their cyclotron rotation.

Sources of the present invention also differ from helicon sources, primarily in the method of wave excitation. The main difference between the two types of sources is in the RF "emitter". In a helicon source, the emitter is an antenna in which the RF currents are responsible for the excitation of electric and magnetic fields in the plasma. In the sources of the present invention, the emitter is an electrode in which the RF electric field is responsible for the excitation of the electric field in the plasma. As a result, the sources of the present invention can be more efficient than the helicon source, with all of the power going into the most effective power deposition channel.

In the RF sources according to the present invention, increased magnetic fields lead to a reduction in RF voltage, increase in plasma density, and decrease in electrode sputtering rate.

Magnet structure has been proposed by Derrek Andrew Russell, co-inventor of the present invention, for producing a magnetic field parallel to the surface of a target. This is described in the commonly assigned and copending U.S. patent application Ser. No. 10/324,213, hereby expressly incorporated by reference herein.

The invention has been described in the context of exemplary embodiments. Those skilled in the art will appreciate that additions, deletions and modifications to the features described herein may be made without departing from the principles of the present invention.

The invention claimed is:

1. A method of producing a high-density plasma in the chamber of a vacuum processing apparatus comprising:
   providing an annular magnet pack having sufficient strength and volume to produce a magnetic field extending into the processing chamber;
   embedding an electrode in the magnetic field in the processing chamber with the magnetic flux substantially parallel to the surface of the electrode; and
   energizing the electrode with RF energy to capacitively couple the energy into the chamber to produce a high-density plasma therewith;
   the providing and embedding steps including providing a capacitively coupled source comprising:
      an electrode having an annular surface within the vacuum chamber,
      an RF generator having an output coupled to the electrode,
      a magnet pack including:
         an outer side magnet having its polar axes intersecting the surface of the electrode with a first pole thereof closer to the electrode and a second note thereof more remote from the electrode,
         an inner side magnet having its polar axes intersecting the surface of the electrode with a first pole thereof closer to the electrode and a second pole thereof more remote from the electrode, and
         a ferromagnetic back piece extending between, and adjacent to, the second poles of the inner and outer side magnets, and
      the magnets of the magnet pack have sufficient volume and strength to produce a magnetic field that extends generally from the first pole of the outer magnet to the first pole of the inner magnet, the electrode being embedded in the magnetic field.

2. The method of claim 1 for manufacturing semiconductors further comprising:
   processing a semiconductor wafer in the chamber with the high-density plasma.

3. The method of claim 1 for manufacturing semiconductors further comprising:
   ionizing coating material in the chamber with the high-density plasma; and
   coating a semiconductor wafer with ionized coating material.

4. The method of claim 1 further comprising:
   removing an ICP source from a processing apparatus; and
   the providing and embedding steps include replacing the ICP source with a capacitively coupled source.

5. A method of producing a high-density plasma in the chamber of a vacuum processing apparatus comprising:
   providing an annular magnet pack having sufficient strength and volume to produce a magnetic field extending into the processing chamber;
   embedding an electrode in the magnetic field in the processing chamber with the magnetic flux substantially parallel to the surface of the electrode;
   energizing the electrode with RF energy to capacitively couple the energy into the chamber to produce a high-density plasma therewith;

removing an ICP source from a processing apparatus; and
the providing and embedding steps including replacing the ICP source with a capacitively coupled source comprising:
an electrode having an annular surface within the vacuum chamber,
an RF generator having an output coupled to the electrode,
a magnet pack including:
an annular surface magnet having an inner pole and an outer pole and having axes of polarity extending between its poles, lying in a radial plane and generally parallel to the surface of the electrode,
an outer side magnet having its polar axes intersecting the surface of the electrode with a first pole thereof closer to the electrode and a second pole thereof more remote from the electrode, the first pole being adjacent to, and of the same polarity as, the outer pole of the surface magnet,
an inner side magnet having its polar axes intersecting the surface of the electrode with a first pole thereof closer to the electrode and a second pole thereof more remote from the electrode, the first pole thereof being adjacent to, and of the same polarity as, the inner pole of the surface magnet, and
a ferromagnetic back piece extending between, and adjacent to, the second poles of the inner and outer side magnets, and
the magnets of the magnet pack have sufficient volume and strength to produce a magnetic field that extends generally from the outer pole of the surface magnet and first pole of the outer magnet to the inner pole of the surface magnet and the first pole of the inner magnet, the electrode being embedded in the magnetic field.

6. The method of claim 1 wherein:
the embedding step includes providing the electrode having a generally concave surface and embedding the electrode in the magnetic field with the surface thereof extending outwardly into the chamber.

7. The method of claim 1 further comprising:
locating the magnet pack and electrode in the center of an annular target of a sputter coating apparatus to capacitively couple RF energy from the electrode to a high density plasma in a chamber of the apparatus.

8. The method of claim 1 further comprising:
locating the magnet pack and electrode in the center of an annular target of a sputter coating apparatus; and
confining the magnetic field inwardly of the annular target.

9. A method of producing a high-density plasma in the chamber of a vacuum processing apparatus comprising:
providing an annular magnet pack having sufficient strength and volume to produce a magnetic field extending into the processing chamber;
embedding an electrode in the magnetic field in the processing chamber with the magnetic flux substantially parallel to the surface of the electrode;
energizing the electrode with RF energy to capacitively couple the energy into the chamber to produce a high-density plasma therewith; and
the providing and embedding steps including providing a capacitively coupled source comprising:
an electrode having an annular surface within the vacuum chamber,
an RF generator having an output coupled to the electrode,
a magnet pack including:
an annular surface magnet having an inner pole and an outer pole and having axes of polarity extending between its poles, lying in a radial plane and generally parallel to the surface of the electrode,
an outer side magnet having its polar axes intersecting the surface of the electrode with a first pole thereof closer to the electrode and a second pole thereof more remote from the electrode, the first pole being adjacent to, and of the same polarity as, the outer pole of the surface magnet,
an inner side magnet having its polar axes intersecting the surface of the electrode with a first pole thereof closer to the electrode and a second pole thereof more remote from the electrode, the first pole thereof being adjacent to, and of the same polarity as, the inner pole of the surface magnet, and
a ferromagnetic back piece extending between, and adjacent to, the second poles of the inner and outer side magnets, and
the magnets of the magnet pack have sufficient volume and strength to produce a magnetic field that extends generally from the outer pole of the surface magnet and first pole of the outer magnet to the inner pole of the surface magnet and the first pole of the inner magnet, the electrode being embedded in the magnetic field.

10. The method of claim 9 wherein the ferromagnetic back piece includes a back magnet having an outer pole adjacent to, and of the opposite polarity as, the second pole of the outer side magnet and having an inner pole adjacent to, and of the opposite polarity as, the second pole of the inner side magnet.

11. The method claim 9 wherein the capacitively coupled source further comprises:
a shield of ferromagnetic material on the opposite side of the magnet pack from the electrode and extending around the outer side magnet, the shield being configured to substantially confine the magnetic flux radially inward from the outer side magnet.

12. The method claim 9 wherein the ferromagnetic back piece includes a shield of ferromagnetic material on the opposite side of the magnet pack from the electrode and extending around the outer side magnet, the shield being configured to substantially confine the magnetic flux radially inward from the outer side magnet.

13. The method claim 9 wherein:
the outer side magnet is an outer ring magnet near an outer edge of the surface of the electrode; and
the inner side magnet is an inner ring magnet near an inner edge of the surface of the electrode.

14. The method claim 9 wherein:
the magnets of the magnet pack have sufficient volume and strength to produce a magnetic field such that substantially all of the magnetic flux is confined to the vicinity of the plasma source.

15. The method claim 9 wherein the surface of the electrode that faces the chamber is convex and curves outward into the chamber.

16. The method claim 9 wherein the magnetic field is generally congruent with the surface of the electrode that faces the chamber.

17. The method claim 9 wherein:
the electrode has an opening at its center.

18. The method claim 9 wherein:
the magnets have a coating of electrically conductive material on the surfaces thereof.

19. The method claim 9 wherein:
the source is a replacement source configured to provide a drop-in replacement to an ICP source of an iPVD apparatus.

* * * * *

UNITED STATES PATENT AND TRADEMARK OFFICE
CERTIFICATE OF CORRECTION

PATENT NO.       : 7,084,573 B2
APPLICATION NO.  : 10/794360
DATED            : August 1, 2006
INVENTOR(S)      : Mirko Vukovic et al.

It is certified that error appears in the above-identified patent and that said Letters Patent is hereby corrected as shown below:

Column 3, line 8, reads "alternatives configurations may be" and should read --alternative configurations may be--

Column 3, line approx. 18, reads "an electromagnetic, and an" and should read --an electro-magnetic, and an--

Column 3, line approx. 25, reads "the electromagnetic wave is" and should read --the electro-magnetic wave is--

Column 3, line approx. 45-46, reads "hardware simplicity of . . .make an attractive alternative to the" and should read --hardware simplicity of . . .makes an attractive alternative to the--

Column 8, line 29, CLAIM 1, reads "and a second note thereof more remote" and should read --and a second pole thereof more remote--

Column 10, line 38, CLAIM 11, reads "The method claim 9 wherein" and should read --The method of claim 9 wherein--

Column 10, line 45, CLAIM 12, reads "The method claim 9 wherein" and should read --The method of claim 9 wherein--

Column 10, line 51, CLAIM 13, reads "The method claim 9 wherein" and should read --The method of claim 9 wherein--

Column 10, line 57, CLAIM 14, reads "The method claim 9 wherein" and should read --The method of claim 9 wherein--

Column 10, line 62, CLAIM 15, reads "The method claim 9 wherein" and should read --The method of claim 9 wherein--

Column 10, line 65, CLAIM 16, reads "The method claim 9 wherein" and should read --The method of claim 9 wherein--

UNITED STATES PATENT AND TRADEMARK OFFICE
CERTIFICATE OF CORRECTION

PATENT NO. : 7,084,573 B2
APPLICATION NO. : 10/794360
DATED : August 1, 2006
INVENTOR(S) : Mirko Vukovic et al.

It is certified that error appears in the above-identified patent and that said Letters Patent is hereby corrected as shown below:

Column 11, CLAIM 17, reads "The method claim 9 wherein" and should read --The method of claim 9 wherein--

Column 11, CLAIM 18, reads "The method claim 9 wherein" and should read --The method of claim 9 wherein--

Column 12, CLAIM 19, reads "The method claim 9 wherein" and should read --The method of claim 9 wherein--

Signed and Sealed this

Second Day of December, 2008

JON W. DUDAS
*Director of the United States Patent and Trademark Office*